United States Patent
Sun et al.

(10) Patent No.: US 6,647,036 B1
(45) Date of Patent: Nov. 11, 2003

(54) INTEGRATION AND ALIGNMENT OF VCSEL'S WITH MEMS USING MICROMACHINING AND FLIP-CHIP TECHNIQUES

(75) Inventors: Decai Sun, Los Altos, CA (US); Michel A. Rosa, San Jose, CA (US)

(73) Assignee: Xerox Corporation, Stamford, CT (US)

( * ) Notice: Subject to any disclaimer, the term of this patent is extended or adjusted under 35 U.S.C. 154(b) by 302 days.

(21) Appl. No.: 09/731,154

(22) Filed: Dec. 6, 2000

(51) Int. Cl.[7] .............................. H01S 3/04; H01S 3/00; H01L 23/02; H01L 29/40
(52) U.S. Cl. ..................... 372/36; 372/14; 372/109; 257/731; 257/778; 257/676; 257/779
(58) Field of Search .............................. 372/14, 36, 109; 257/731, 778, 676, 779

(56) References Cited

U.S. PATENT DOCUMENTS

| | | | | |
|---|---|---|---|---|
| 5,311,059 A | * | 5/1994 | Banerji et al. | 257/778 |
| 5,521,931 A | * | 5/1996 | Biegelsen et al. | 372/36 |
| 5,729,026 A | * | 3/1998 | Mamin et al. | 250/492.2 |
| 6,147,397 A | * | 11/2000 | Burns et al. | 257/669 |
| 6,150,724 A | * | 11/2000 | Wenzel et al. | 257/777 |
| 6,210,984 B1 | * | 4/2001 | Farnworth et al. | 438/15 |
| 6,421,474 B2 | * | 7/2002 | Jewell et al. | 385/14 |

OTHER PUBLICATIONS

Deborah S. Patterson, Flip Chip Technologies, 3701 E. University Drive, Phoenix, AZ, Seminar, *A Comparison of Popular Flip Chip Bumping Technologies* (Test, Assembly & Packaging Conference (InterPACK '97), in Kona, HW, 1997).

* cited by examiner

Primary Examiner—Jerome Jackson
Assistant Examiner—Joseph Nguyen
(74) Attorney, Agent, or Firm—Fay, Sharpe, Fagan, Minnich & McKee, LLP (57) ABSTRACT

A micro-electromechanical system assembly is designed to integrate a laser. More particularly, laser is a vertical cavity surface-emitting laser. The MEMS assembly includes a micro-electromechanical substrate having an upper surface and a lower surface, the upper surface defined as having a first area and a second area. A first substrate bonding pad is positioned on the upper surface at a location within the first area, and a second substrate bonding pad is positioned on the upper surface at a location within the second area. Deposited upon the first and second substrate bonding areas are respective first and second solder material. A laser to be integrated in the MEMS assembly has a first laser bonding pad located on a first side, and a second laser bonding pad located on a second side. The laser is placed between the first substrate bonding pad and second substrate bonding pad such that they align with the respective first and second laser bonding pads. Upon a reflow of the solder material, a precise alignment of the laser is obtained while the reflow process occurs, and at the same time providing a mechanical and electrical connection between the bonding pads. In a further embodiment, the MEMS substrate is configured with a trench portion into which is placed the laser having the first and second laser bonding pads. Placement in the trench, is at least one of a 45° and 54.74° angle. Upon reflow of solder material on the substrate, the laser is finely positioned and held mechanically stable. In a further embodiment, the trench previously described includes a spring mechanism which carries a substrate bonding pad. The spring mechanism causing the laser within the trench to be maintained in a preferred position during and after the solder reflow process. Still yet another embodiment employs bimetallic cantilevers for positioning the laser and electrical interconnect.

18 Claims, 10 Drawing Sheets

INTEGRATION AND ALIGNMENT OF VCSEL'S WITH MEMS USING MICROMACHINING AND FLIP-CHIP TECHNIQUES

The U.S. Government has a paid up license in this invention and right, in limited circumstances, to require the patent owner to license others on reasonable terms as provided for by the terms of Contract No. 70NANB8H4014, awarded by NIST.

BACKGROUND OF THE INVENTION

The use of flip-chip technologies for integration of integrated circuits on a printed circuit board, as well as other integrated circuits in special configuration modules, starting to be used in certain areas. Flip-chip technology has proven itself a reliable and cost effective alternative to other integrated circuit integration techniques, including the use of Multi-Chip Module (MCM) technology. However, though this relatively new integration technology has started to become used in certain areas, many potential advantages in terms of product diversity and functionality have yet to be explored. Therefore, it has been deemed desirable to apply flip-chip technology to areas not previously explored, such as micro-machining techniques to obtain improvements therein.

SUMMARY OF THE INVENTION

A micro-electromechanical system assembly is designed to integrate a laser into its structure. The laser may be a vertical cavity surface-emitting laser (VCSEL). The MEMS assembly includes a micro-electromechanical substrate having an upper surface and a lower surface, the upper surface defined as having a first area and a second area. A first substrate bonding pad is positioned on the upper surface at a location within the first area, and a second substrate bonding pad is positioned on the upper surface at a location within the second area. Deposited upon the first and second substrate bonding areas are respective first and second solder material. A laser to be integrated in the MEMS assembly has a first laser bonding pad located on a first side, and a second laser bonding pad located on a second side. The laser is placed between the first substrate bonding pad and second substrate bonding pad such that they align with the respective first and second laser bonding pads. Upon a reflow of the solder material, a precise alignment of the laser is obtained while the reflow process occurs, at the same time providing a mechanical and electrical connection between the bonding pads. In a further embodiment, the MEMS substrate is configured with a trench portion into which is placed the laser having the first and second laser bonding pads. Placement of the laser in the trench, is at least one of a 45° and 54.74° from the substrate surface. Reflowing of solder on the substrate results in the laser being finely positioned and held mechanically stable.

In yet a further embodiment, the trench previously described includes a spring mechanism which carries a substrate bonding pad. The spring mechanism causing the laser within the trench to be maintained in a preferred position during and after the solder reflow process. Still yet another embodiment employs bimetallic cantilevers for positioning the laser and electrical interconnect.

DETAILED DESCRIPTION OF THE PREFERRED EMBODIMENTS

Figure 1:
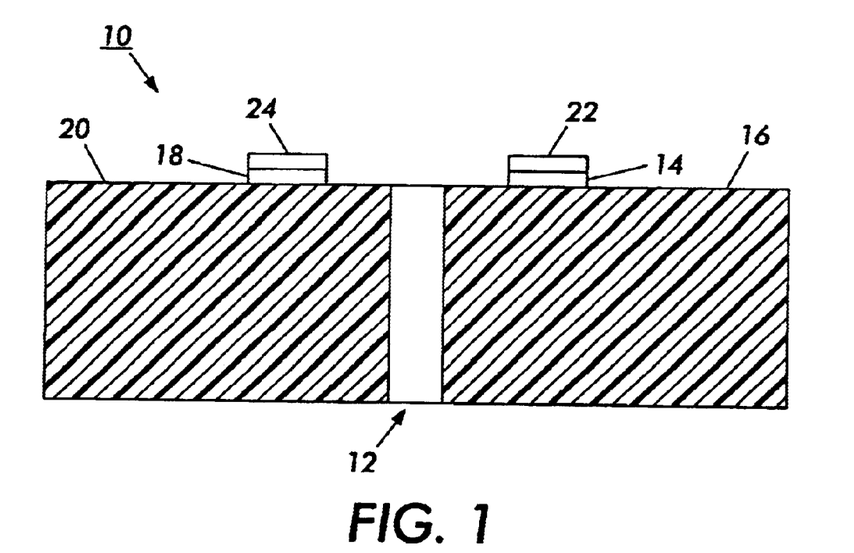
FIG. 1 depicts a MEMS substrate processed in accordance with concepts of the present invention.

FIG. 1 illustrates a MEMS substrate 10 partially manufactured in accordance with a first embodiment of the present invention. Particularly, substrate 10 has been patterned and processed to have an etched vacuum hole 12 running the depth of the substrate. Further processed is a first bonding pad 14 located at a first area 16 of the substrate and a second bonding pad 18 located at a second area of the substrate 20. The bonding pads 14 and 18 are of a material which allows solder to wet to the surface thereby constricting its shape to the bonding pad. In one embodiment the bonding pads 14 and 18 may be areas of gold lithographically defined on substrate 10. Patterned on the upper surface of the respective pads 14 and 18 are solder layers 22 and 24. The solder layers are composed of a lead and tin mixture, wherein the percentages of the lead and tin determine the solder type. Solder layers consist of solder material remaining after removal of excess solder. The patterning techniques and MEMS substrate necessary for obtaining the process substrate of FIG. 1 are known in the art.

Figure 2:
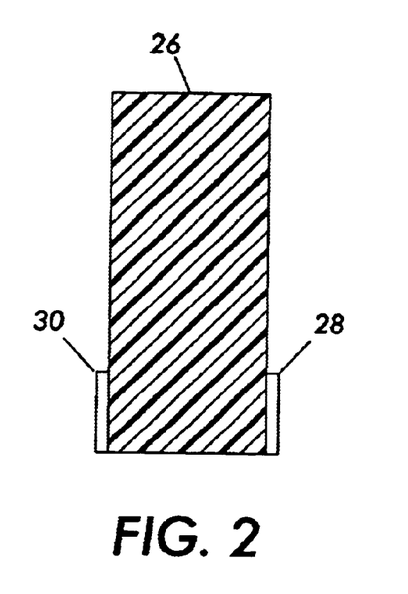
FIG. 2 sets forth a laser to be integrated to the substrate of FIG. 1.
Figure 3:
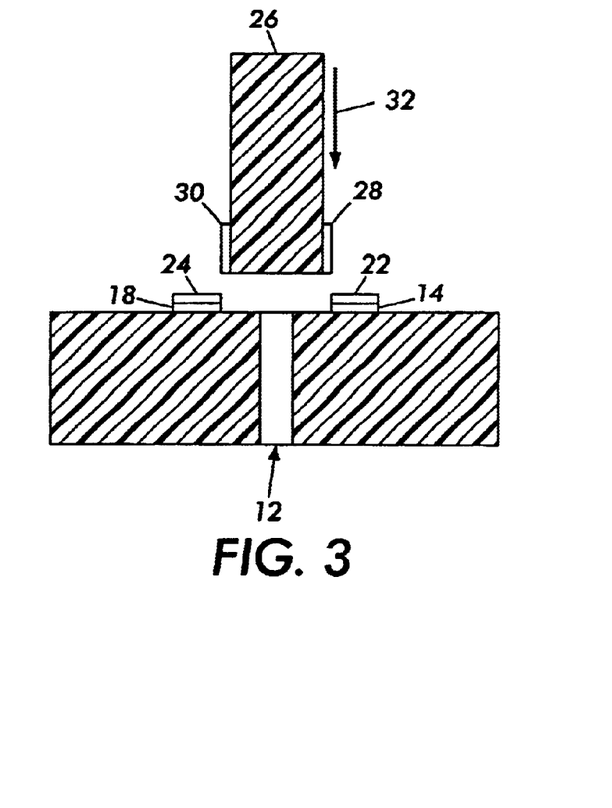
FIG. 3 sets forth the insertion of the laser assembly into the appropriately processed MEMS substrate.
Figure 4:
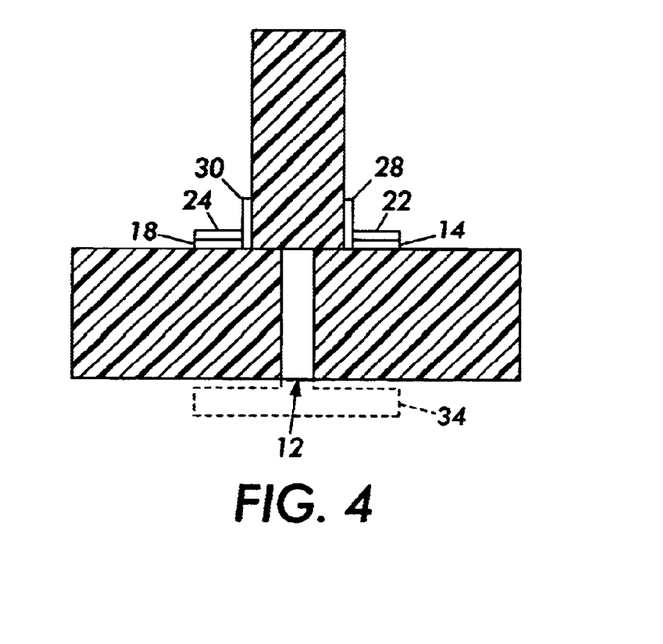
FIG. 4 illustrates the laser and substrate in a received position prior to solder reflow.

Turning to FIG. 2, set forth is a laser diode or chip 26, which in this embodiment is a vertical cavity surface emitting laser (VCSEL). Deposited on first and second sides of laser 26 are first and second laser bonding pads 28 and 30. These laser bonding pads are comprised of a material which will allow solder to wet to its surface. The material may, for example, be of gold. Bonding pads 28, 30 may be formed by known lithographic techniques. With attention to FIG. 3, as shown by arrow 32, laser 26 is moved into a space between the first and second substrate bonding pads 14 and 18 such that laser 26 is located over vacuum hole 12. The placement of laser 26 may be accomplished by known pick-and-place techniques. As shown in FIG. 4, a vacuuming apparatus 34 is in an operable connection to a bottom surface side of vacuum hole 12. Use of vacuum system 34 creates a vacuum to hold the laser 26 in coarse alignment while final assembly processes are undertaken. As may be noted in FIG. 4, solder layers 22 and 24 are in a non-molten state.

In a next step of the assembly a solder reflow process is undertaken, by application of heat solder layers 22, 24. The heating may be achieved by any one of many known techniques, such as a heating of the entire assembly, or the application of localized heat through the use of heat probes (not shown) in contact with the solder. As the reflow process is undertaken, the vacuum effect created by vacuum device 34 is removed to allow for a fine alignment of the laser to be achieved. Removing the vacuum allows laser 26 to move with a surface tension created during the reflow process as the solder layers 22 and 24 reform into solder bumps.

Particularly, the present application uses a characteristic of solder bonding wherein during the reflow process the solder layer is reformed into a bump or ball configuration as surface tension of the solder material pulls itself into a spherical shape. Specifically, it is known that solder wets to gold. Therefore, the positional relationship between substrate bonding pads and 14 and 18 and the laser bonding pads 28 and 30 are used advantageously to obtain a fine alignment of the laser 26. As the reflow process takes place and the solder material moves to a molten state, the solder adheres not only to substrate bonding pads 14 and 18, but due to its physical proximity to laser bonding pads 28 and 30, it also adheres to these pads as it reforms itself into a spherical shape. As the reshaping of solder layers 22, 24 is taking place, laser bonding pads 28 and 30 are pulled, and the laser 26 to which they are integrated is also moved. The reforming of the solder layers 22 and 24 into solder bumps or balls, occurs as the surface tension of the solder attempts to revert to a minimal energy form. While solder layers 22 and 24 are shown as substantially rectangular elements, they may also be originally formed as a disc or other shape.

The precise position of laser movement, is analytically determinable by taking into consideration the parameters of the elements being used. Specifically, knowing the size, shape, height of the solder and components/elements, as well as the solder makeup, a determination of pressures exerted by the reflowing process may be calculated to translate this information into a specific movement. In experiments, the inventors have been able to determine the fine alignment capabilities to within one to two microns. For example, for two solder pads of 37%/wt lead, 63%/wt tin on bonding pads sized ~70 μm and distanced from each other ~140 μ, a laser having a width of ~500 μm, a length of ~500 μm and a height of ~100 μm, the laser will move ~2–3 μm.

Figure 5:
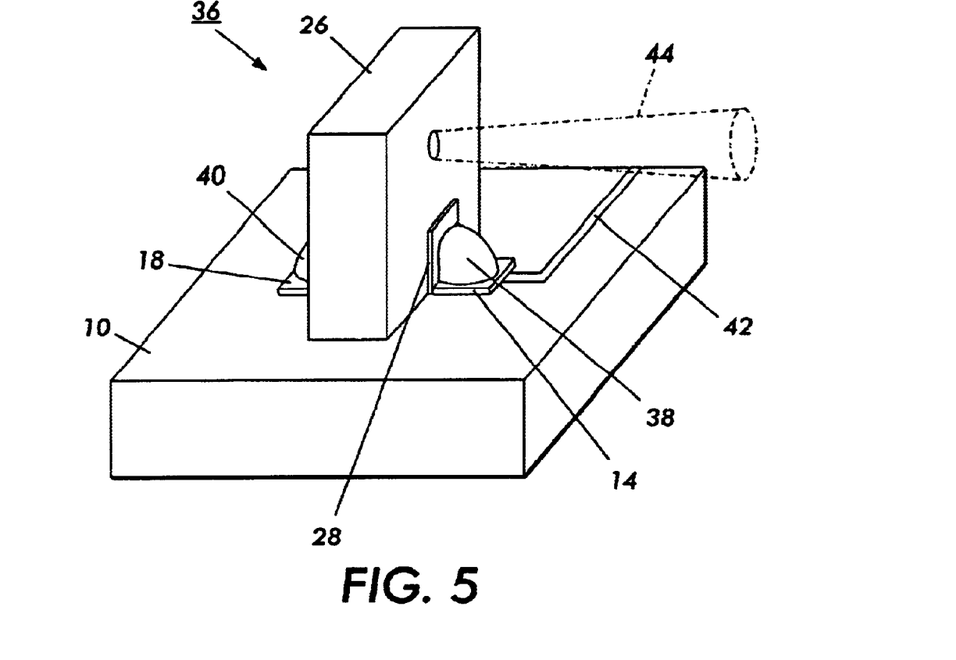
FIG. 5 sets forth the completed MEMS assembly integrating a VCSEL according to an embodiment of the present invention.
Figure 6:
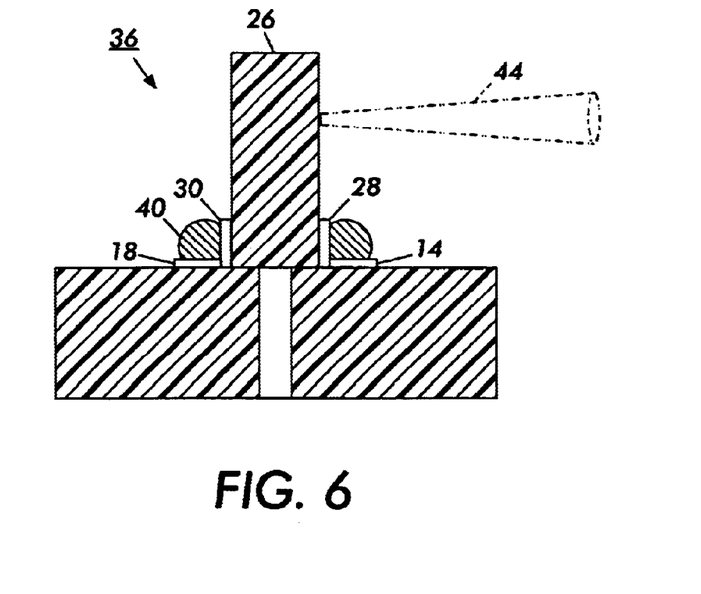
FIG. 6 is a cross-sectional view of the system of FIG. 5.

Turning to FIGS. 5 and 6, illustrated is a MEMS structure and laser assembly 36 according to a first embodiment. As can be seen in this figure, solder bumps 38 and 40, formed from solder layers 22 and 24, adhere to both the substrate bonding pads 14 and 18, as well as the laser bonding pads 28 and 30. For generation of a fully operational system, electrical connections or traces 42 may be patterned on substrate 10 to allow for operation of the laser wherein a laser beam 44 emitted by laser 26 is substantially parallel to the substrate 10 surface. It is to be appreciated that bonding pads 14, 18, 28, 30 are drawn larger than they would be in actual implementation. This exaggerated view is to allow observation of the pads. In an actual implementation edges of the solder bump would extend to the edges of the pads, the surface tension of the solder keeping the solder from spilling over the edges of the pads.

From the foregoing, it can be understood that solder bumps 38 and 40 serve multiple purposes. Initially they act to finely align laser 26, and then once holding the laser 26 in place, they act as electrical interconnects to the substrate and laser bonding pads. Electrical connections or traces 42 may be signal lines, power supply and/or control signals from a controller/power supply chip 46 which may also be integrated on substrate 10.

Figure 7:
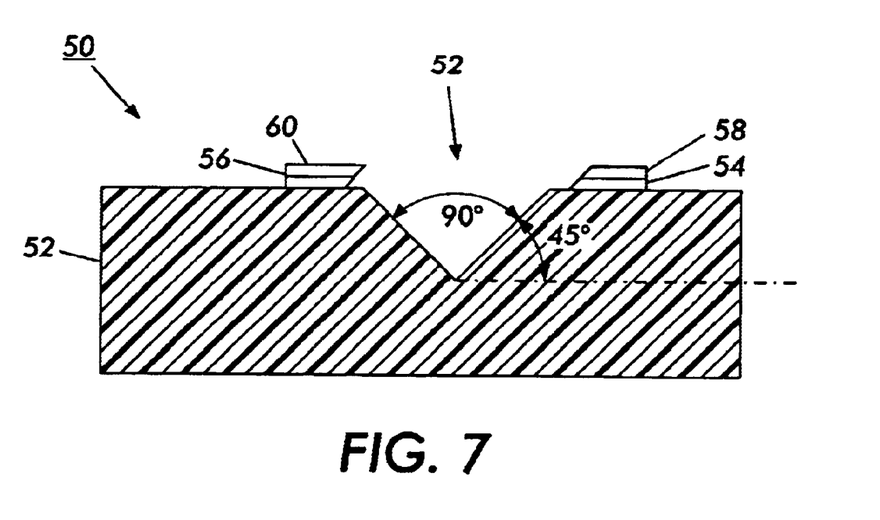
FIG. 7 sets forth a second substrate embodiment for use in connection with the present application.

Turning to FIG. 7, illustrated is a substrate 50 processed for use in accordance with a second embodiment. Trench 52 is formed by standard lithographic etching techniques. Where the trench to be etched is aligned to the <110> crystal plane and etched with an Ethylene Diamine Pyrocatechol (EDP) wet etchant, giving a sidewall incline of ~45°. Further, and similar to substrate 10 of FIG. 1, formed are first and second substrate bonding pads 54 and 56. Deposited on top of these pads are first and second solder layers 58 and 60. As can be seen in this embodiment, substrate bonding pads 54, 56 and solder layers 58 and 60 are formed to substantially follow the angles of trench 52.

Figure 8:
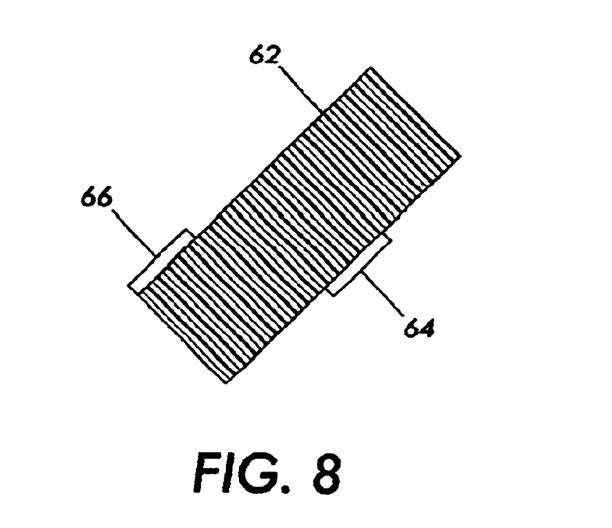
FIG. 8 sets forth an appropriately processed laser which may be integrated into the substrate of FIG. 7.

FIG. 8 depicts a laser 62 such as a VCSEL laser similar to that of FIG. 2. Patterned on first and second sides of laser 62 are first and second laser bonding pads 64, 66. These are positioned at an appropriate height from the bottom of laser 62 such that when laser 62, as shown in FIG. 9, is inserted within trench 52, laser bonding pads 64 and 66 are aligned with substrate bonding pads 54 and 56 and in contact with at least a portion of solder layers 58, 60.

Figure 9:
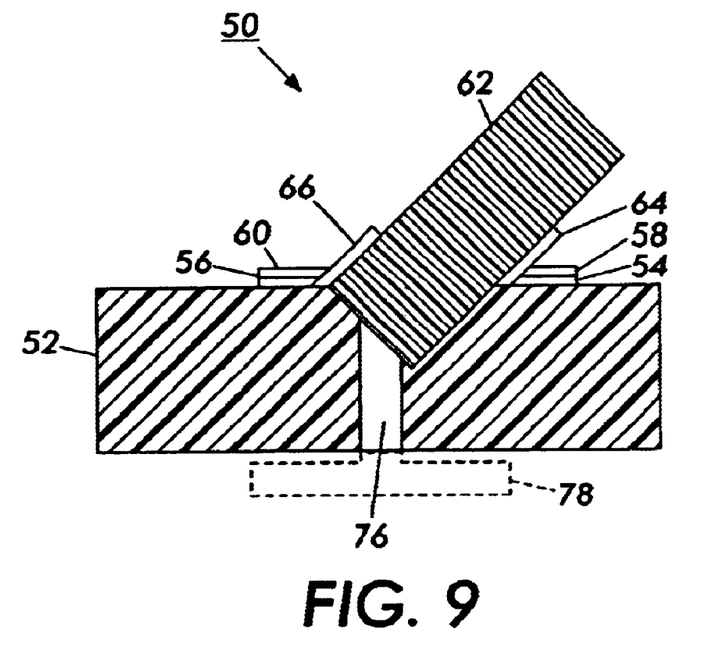
FIG. 9 depicts the laser assembly of FIG. 8 in course attachment with the MEMS substrate of FIG. 7.
Figure 10:
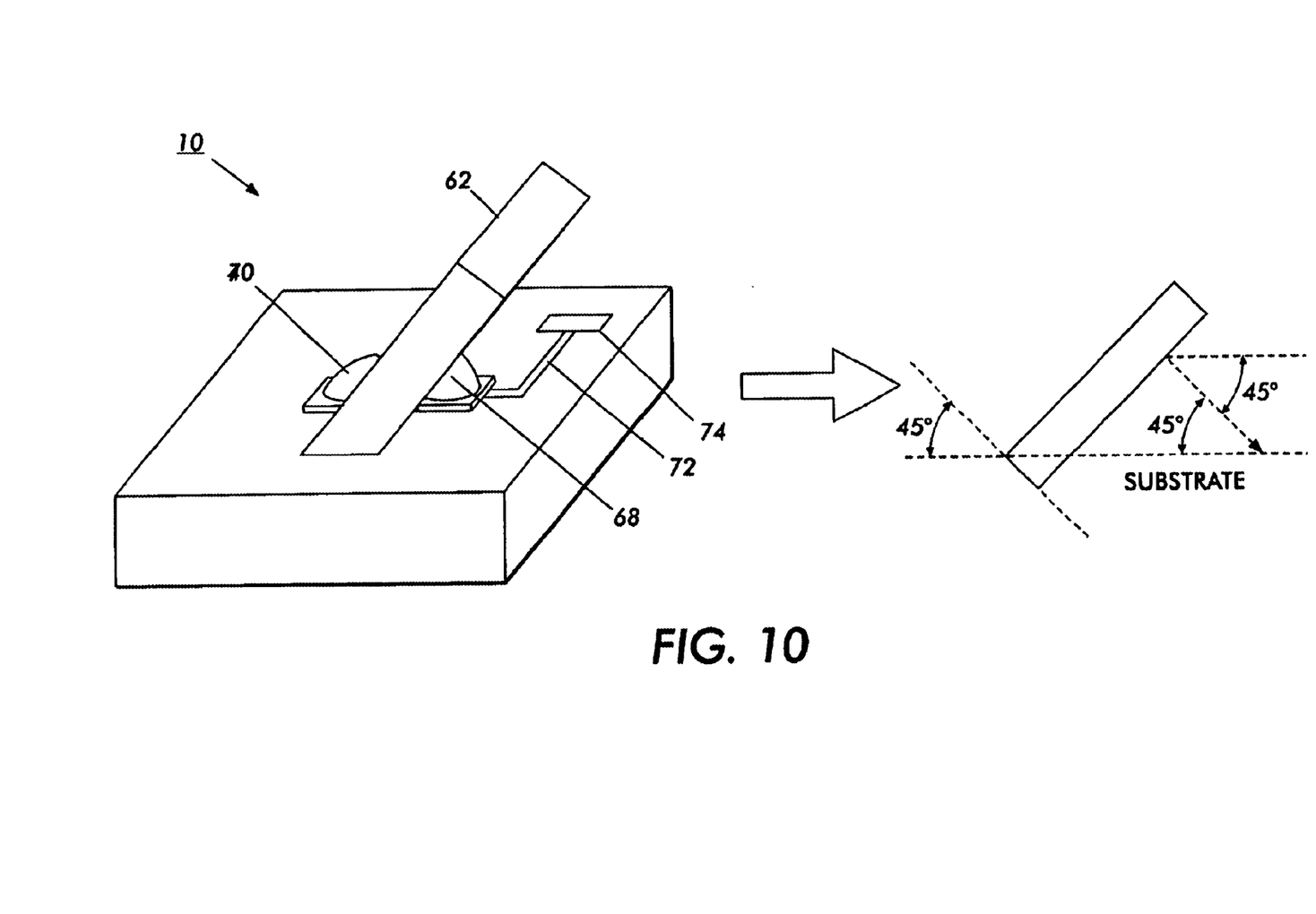
FIG. 10 sets for the completed MEMS assembly with an integrated VCSEL according to a second embodiment of the present invention.

The arrangement of FIG. 9 provides for a coarse alignment of laser 62. To achieve fine alignment of laser 62, solder layers 58 and 60 are reflowed in a manner similar to that discussed in connection with the first embodiment. This reflowing process, causes solder layers 58 and 60 to reform into spherical bumps 68, 70, such as shown in FIG. 10. As the molten solder wets to laser bonding pads 64 and 66, laser 62 is moved and precisely aligned to a desired position. Similar to the preceding embodiment, the solder bumps 68 and 70 not only provide mechanical holding of laser 62, but also provide an electrical connection between the laser bonding pads and substrate bonding pads. The implementation shown in FIG. 10, also includes and electrical tracing or connect 72 between the bonding pads and a driver or power chip 74.

To hold laser 62 during the coarse alignment, the present embodiment may also pattern substrate 50 to have a vacuum hole 76, shown more clearly in FIG. 9, to hold the laser 62 with a vacuum force generated by vacuum unit 78 until solder reflow takes place.

The preparation of substrate 50 to obtain a trench, pads, and solder layers with sidewall angles of 45° can be performed using an anisotropic silicon etchant such as Ethylene Diamine Pyrocatechol (EDP). The 45° angled sidewalls can be achieved by using EDP at appropriate concentration above a certain threshold and in conjunction with alignment to the planes of a silicon wafer 50. However, it is to also be appreciated that the wet etching and sidewall angles of 54.74° may also be achieved using anisotropic silicon etchants. Therefore, the present embodiment shown in FIG. 10 may in addition to being manufactured at an angle of 45°, may also be angled at an angle of 54.74°.

Unlike the previous integration process, the technique described here allows for the passive orientation of the integrated laser such that the emitted beam is 45° or 54.74° to the surface of the MEMS substrate 50. This integration permits flexibility in device design and may suit various styles of scanning applications.

The techniques which produce a laser beam, not parallel to the substrate surface provides advantages such as the further coupling of the beam with the surface or bulk micromachine components to scan the beam out of plane of the MEMS substrate, so as for example to couple with external optical device.

Figure 11:
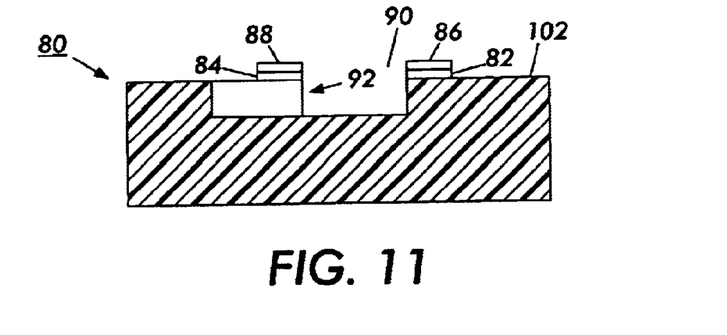
FIG. 11 depicts a processed substrate according to a third embodiment of the present invention.
Figure 12:
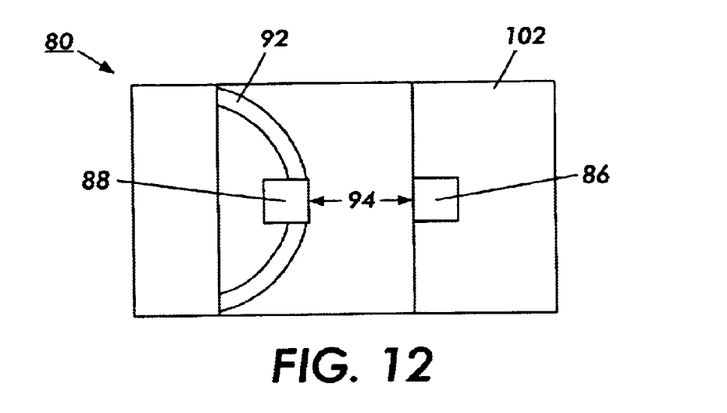
FIG. 12 is a top view of the substrate of FIG. 11.
Figure 13:
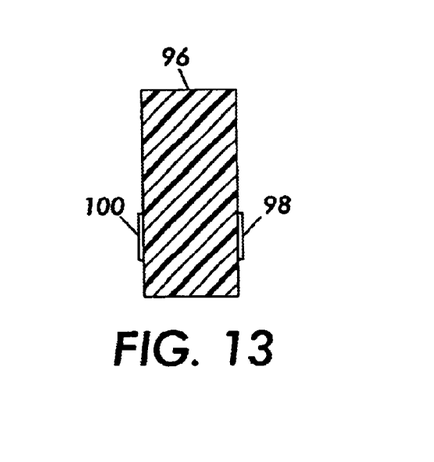
FIG. 13 is a side view of a processed laser to be integrated in the substrate of FIG. 11.
Figure 14:
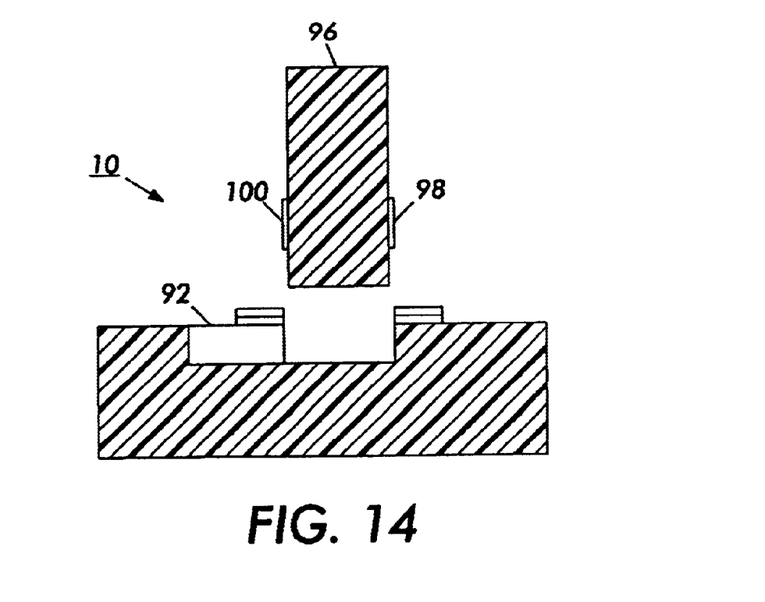
FIG. 14 is an illustration of the laser of FIG. 13 in course connection or alignment with the substrate of FIG. 11.
Figure 15:
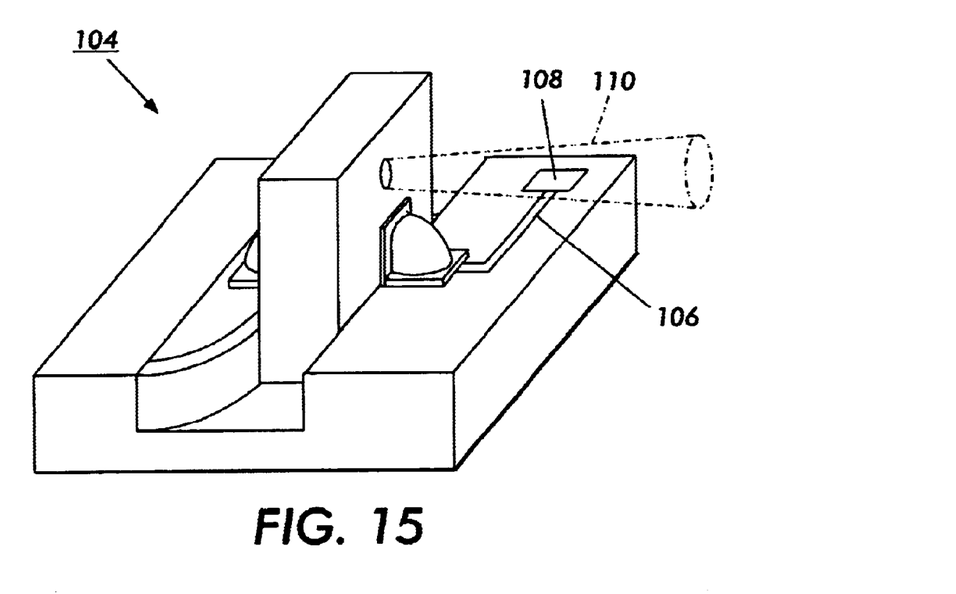
FIG. 15 depicts a completed MEMS substrate integrating a VCSEL for a third embodiment of the present invention.

Turning to a third embodiment, FIGS. 11 and 12 show side and top views of substrate 80. Similar to previous embodiments, substrate 80 has patterned substrate bonding pads 82, 84 and solder layers 86, 88. Additionally, a trench 90 is lithographically formed within substrate 80 according to known processing techniques. Also patterned in accordance with known lithographic techniques is a spring mechanism 92 extending from an edge of trench 90, where spring mechanism 92 carries bonding pad 84 and solder layer 88. Spring mechanism 92 is sized such that distance 94 between first bonding pad 82 and second bonding pad 88 is slightly smaller than the width of laser 96 of FIG. 13. Laser 96, similar to the previous embodiments, includes laser bonding pads 98 and 100. Initially, the interconnection between substrate 80 and laser 96 is by placing laser 96 into trench 90 by a lateral movement of laser 96 as spring 92 extends into trench 90 such that distance 94 is slightly smaller than the width of laser 96. Bringing laser 96 in from the side and sliding it into position, causes spring 92 to provide a restoring force on the back side of laser 96 which presses the laser 96 up against contact pad 82 in a front area 102 (FIGS. 12,13), coarsely fixing the laser. However, it is to be noted that the pressure applied by spring 92 is not so tight that the laser cannot be further moved. Laser 96 is slid into trench 92 until substrate bonding pads 82 and 84 are aligned with laser bonding pads 98 and 100 (FIG. 14). Thereafter, the solder reflow process as accomplished in previous embodiments is undertaken. This process, again, provides further refinement of the laser location as well as an electrical connection between the bonding pads. MEMS/VCSEL structure 104, formed according to the present embodiment, is shown in FIG. 15, wherein further provided is an electrical trace 106 to a driver or power supply chip 108. It is noted in this embodiment, that the VCSEL laser 96 provides a beam 110 parallel to the substrate surface.

The use of mechanical spring support 92 removes the need for the vacuum hole used in previous embodiments. Also, the mechanical spring used to hold the laser in place before the solder reflow continues to hold the laser after the process has been completed, therefore providing further mechanical support.

The fabrication process for this embodiment is a more complex process than those involved in the previous embodiments. Particularly, the process involves the dry etching of spring 92 and performing lithography and metallization on the spring. It is noted that spring mechanism 92 in FIG. 15 is shown to be formed using the bulk single crystal silicon. However, in practice, the top section of the substrate in which spring 92 is fashioned will be heavily doped. The high doping concentration allows a subsequent anisotropic etching of the undoped and exposed silicon, thereby underetching the heavily doped spring structure and making it free to move. This process is isolated so as not to affect the performance or fabrication processes of any surrounding micro devices which may be found on the MEMS substrate.

Figure 16:
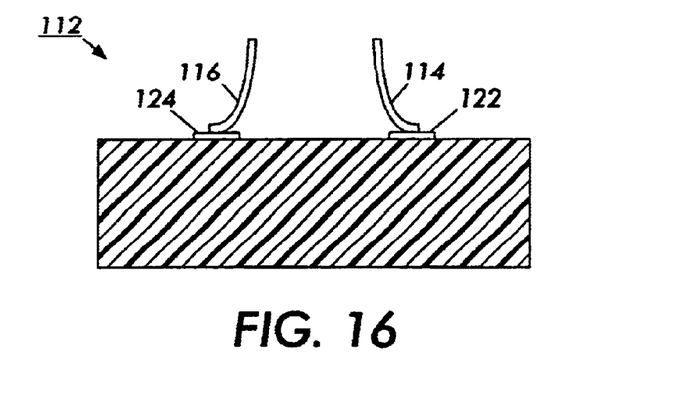
FIG. 16 shows a substrate for a fourth embodiment of the present invention.
Figure 17:
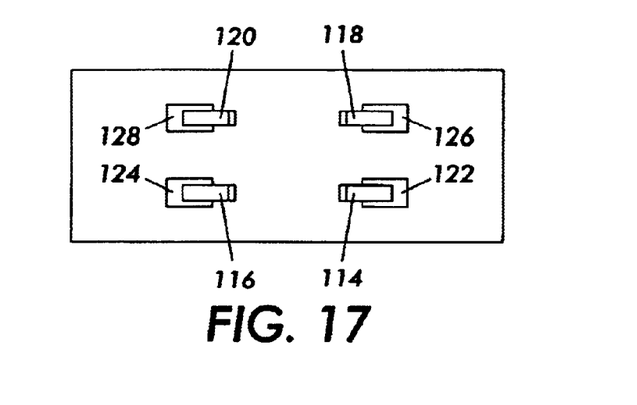
FIG. 17 sets forth a top view of the substrate of FIG. 16.

Turning to FIGS. 16 and 17, set forth are respective side and top views of a substrate 112 used in a fourth embodiment. Substrate 112 is processed to include coupled bimetallic cantilevers 114, 116, 118 and 120. The cantilevers 114–120 are designed and fabricated with a natural stress gradient, thereby allowing them to curl up when released from the substrate 112 during the fabrication process, as shown in FIGS. 16 and 17. One end of cantilevers 114–120 are in contact with corresponding metallized bonding pads 122, 124, 126 and 128.

Figure 18:
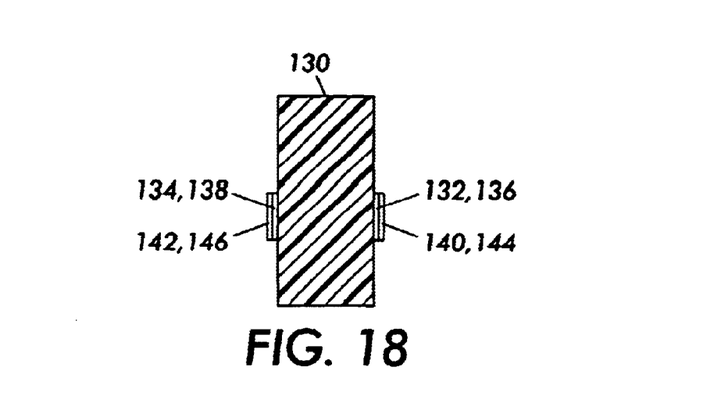
FIG. 18 shows a laser processed in accordance with the fourth embodiment.

FIG. 18 illustrates a laser 130 which will be integrated with substrate 112, having laser bonding pads 132, 134, 136 and 138. Each of the laser bonding pads have solder layers 140, 142, 144 and 146.

Figure 19:
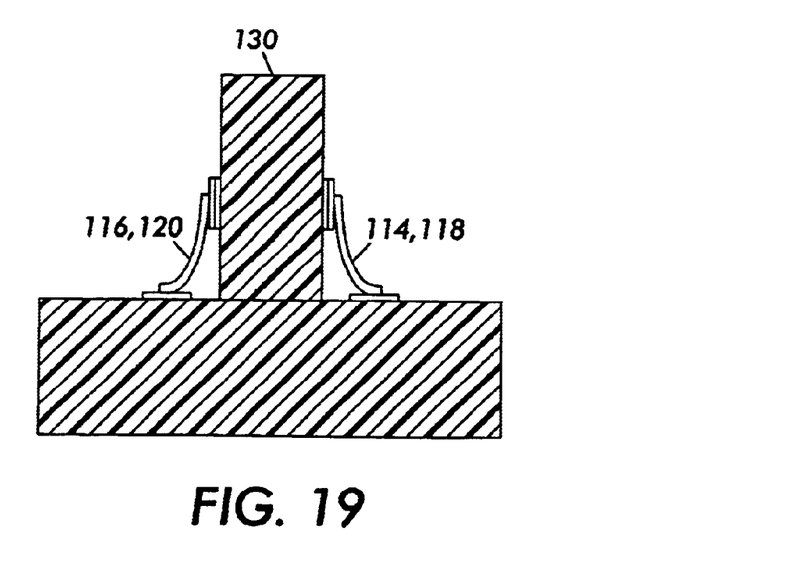
FIG. 19 illustrates the laser of FIG. 18 in course alignment connection with the substrate of FIG. 16.
Figure 20:
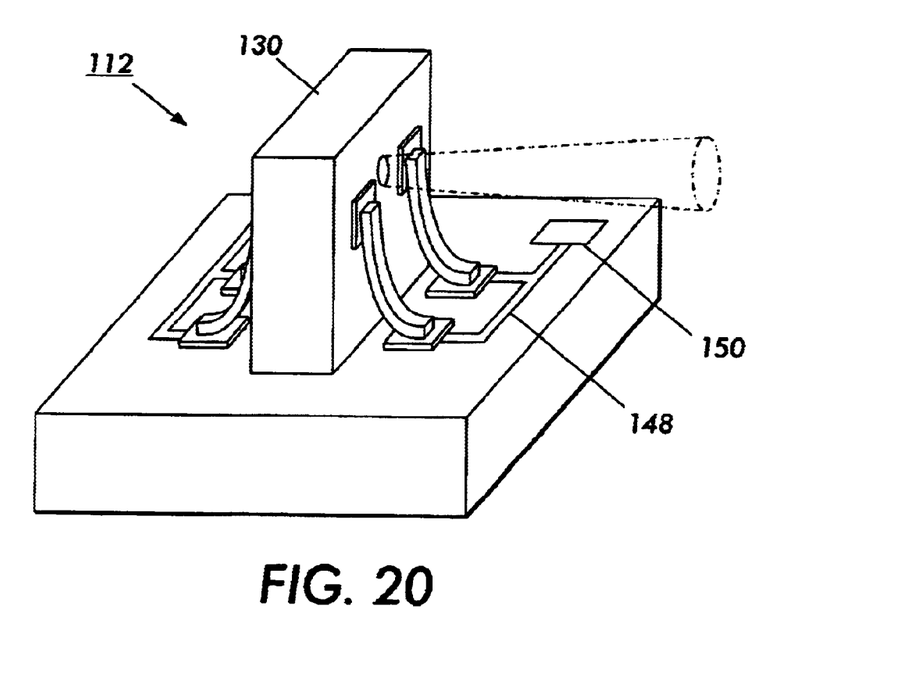
FIG. 20 depicts a completed MEMS substrate integrating a VCSEL according to the teachings of a fourth embodiment of the present invention.

Cantilevers 114–120 are provided with sufficient stress such that the opening between the opposed cantilevers is sufficient to allow insertion of laser 130. When inserted to a coarse alignment position, such as shown in FIG. 19, cantilevers 114–120 act to clamp and hold laser 130. In this situation, the tips of cantilevers 114–120 are in contact with corresponding solder layers 140–146. Thereafter, the solder reflow process is undertaken to obtain a further fine alignment of the laser device 130. Cantilevers connected to the solder also act as electrical interconnects for providing operating voltage, grounding connections and signals as shown in FIG. 20. Particularly, electrical tracings 148 allow for transmission of driver or power supply circuits 150 integrated on substrate 112.

The foregoing discussion describes the cantilevers as passive components. In the passive embodiment, the cantilevers are designed and fabricated with a natural stress gradient which causes them to curl up to a predetermined angle when released from the substrate.

In an alternative embodiment, the bimetallic cantilevers 114–120 may be made active, either by exploitation of thermal expansion coefficients or other known techniques. Particularly, by application of appropriate voltage biases, the cantilevers are opened up sufficiently so that the laser 130 may be easily inserted, whereafter the cantilevers are closed, clamping the laser in place.

While the present invention is described with respect to preferred embodiments, it would be apparent to one skilled in the art to practice the present invention in other configurations and designs. Such alternate embodiments will not cause a departure from the spirit and scope of the present invention.

Having thus described the preferred embodiments, the invention is now claimed to be:

1. A micro-electromechanical assembly incorporating a laser comprising:
   a micro-electromechanical assembly substrate having an upper surface and a lower surface, the upper surface defined as having a first area and a second area, the first area being at an opposite side of the upper surface of the assembly substrate, from the second area;
   a first substrate bonding pad positioned on the upper surface at a location within the first area;
   a second substrate bonding pad positioned on the upper surface at a location within the second area;
   a laser positioned on the upper surface of the micro-electromechanical assembly substrate between the first substrate bonding pad and the second substrate bonding pad, the laser having a first side and a second side, wherein the first side of the laser is an opposite side of the second side of the laser;

a first laser bonding pad located on the first side of the laser, positioned adjacent the first substrate bonding pad;

a second laser bonding pad located on the second side of the laser, positioned adjacent the second substrate bonding pad;

a first solder connection in contact with the first substrate bonding pad and the first laser bonding pad; and a second solder connection in contact with the second substrate bonding pad and the second laser bonding pad.

2. The invention according to claim 1 further including a vacuum hole extending through the micro-electromechanical assembly substrate such that apertures are located on both the first and second surfaces of the substrate, wherein the laser is positioned over the vacuum hole.

3. The invention according to claim 2 further including a vacuum system attached to the vacuum hole, at the lower surface of the substrate.

4. The invention according to claim 1 further including at least a first electrical trace on the upper surface of the substrate, the first electrical trace in connection with the first substrate bonding pad.

5. The invention according to claim 1 wherein the first solder connection and the second solder connection hold the laser assembly in a fixed position.

6. The invention according to claim 1 wherein the first and second solder connections act as electrical interconnects.

7. The invention according to claim 1 wherein the laser assembly is a vertical cavity surface emitting laser assembly.

8. The invention according to claim 1 wherein the laser assembly is perpendicular to the substrate and a laser beam emitted from the laser is parallel to the substrate.

9. The invention according to claim 1 wherein the laser assembly is at a 45 degree angle to a surface of the micro-electromechanical assembly substrate.

10. The invention according to claim 1 wherein the upper surface includes a trench area in which the laser is positioned.

11. The invention according to claim 10 wherein the second area includes a spring mechanism located within the trench.

12. The invention according to claim 10 wherein the laser assembly within the trench area is perpendicular to the substrate and a laser beam emitted from the laser is parallel to the substrate.

13. The invention according to claim 10 wherein the laser assembly within the trench area is between approximately a 45 degree and 54 degree angle to the substrate.

14. The invention according to claim 1 further including a first area cantilever extending between the first substrate bonding pad and the first laser bonding pad; and a second area cantilever extending between the second substrate bonding pad and the second laser bonding pad.

15. The invention according to claim 14 wherein, the contact of the first solder connection between the first substrate bonding pad and the first laser bonding pad is through the first area cantilever; and the contact of the second solder connection between the second substrate bonding pad and the second laser bonding pad is through the second area cantilever.

16. The invention according to claim 14 wherein at least one of the first area cantilever and the second area cantilever is an active cantilever which is selectively movable.

17. The invention according to claim 14 wherein at least one of the first area cantilever and the second area cantilever, connected to the first and the second solder connection, act as an electrical interconnect.

18. The invention according to claim 2, wherein the first laser bonding pad and second laser bonding pad are positioned to locate the laser therebetween and is in direct physical contact with an opening of the vacuum hole.

* * * * *